US011354001B2

(12) United States Patent
Choi et al.

(10) Patent No.: US 11,354,001 B2
(45) Date of Patent: Jun. 7, 2022

(54) DISPLAY DEVICE INCLUDING AN INPUT SENSING PANEL HAVING AN ISLAND PATTERN

(71) Applicant: SAMSUNG DISPLAY CO., LTD., Yongin-si (KR)

(72) Inventors: Wonjun Choi, Seoul (KR); Il-Joo Kim, Hwaseong-si (KR); Deokjung Kim, Busan (KR); Youngbae Jung, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/921,467

(22) Filed: Jul. 6, 2020

(65) Prior Publication Data

US 2021/0048924 A1     Feb. 18, 2021

(30) Foreign Application Priority Data

Aug. 14, 2019   (KR) .................. 10-2019-0099426

(51) Int. Cl.
    *G06F 3/044*       (2006.01)
    *H01L 27/32*      (2006.01)

(52) U.S. Cl.
    CPC .......... *G06F 3/0446* (2019.05); *H01L 27/323* (2013.01); *G06F 2203/04111* (2013.01); *H01L 27/3211* (2013.01)

(58) Field of Classification Search
    CPC ................. G06F 3/0446; G06F 3/0448; G06F 2203/04111; H01L 27/323; H01L 27/3211
    See application file for complete search history.

(56) References Cited

U.S. PATENT DOCUMENTS

| | | | |
|---|---|---|---|
| 9,348,448 B2 | 5/2016 | Song et al. | |
| 9,354,756 B2 | 5/2016 | Huh et al. | |
| 9,430,088 B1 | 8/2016 | Lee et al. | |
| 9,619,091 B2 | 4/2017 | Huh et al. | |
| 2017/0147132 A1* | 5/2017 | Choi | ............ G06F 3/0446 |
| 2018/0188866 A1* | 7/2018 | Heo | ............ H01L 51/5253 |

FOREIGN PATENT DOCUMENTS

| | | |
|---|---|---|
| KR | 10-2014-0095277 | 8/2014 |
| KR | 10-2015-0092384 | 8/2015 |
| KR | 10-1679986 | 12/2016 |
| KR | 10-1799029 | 11/2017 |
| KR | 10-1935628 | 12/2018 |

\* cited by examiner

*Primary Examiner* — Deeprose Subedi
(74) *Attorney, Agent, or Firm* — F. Chau & Associates, LLC

(57) ABSTRACT

A display device includes a display panel including first light emitting areas, second light emitting areas, and third light emitting areas, and an input sensing panel disposed on the display panel and including a first sensing electrode and a second sensing electrode. The first sensing electrode includes first sensing patterns and at least one first connection pattern connecting two first sensing patterns adjacent to each other among the first sensing patterns. The second sensing electrode includes second sensing patterns, at least one island pattern disposed between two second sensing patterns adjacent to each other among the second sensing patterns, and second connection patterns connecting the second sensing patterns and the at least one island pattern. Each side of the at least one island pattern is substantially parallel to at least one side of each of the second sensing patterns.

18 Claims, 14 Drawing Sheets

DISPLAY DEVICE INCLUDING AN INPUT SENSING PANEL HAVING AN ISLAND PATTERN

CROSS-REFERENCE TO RELATED APPLICATION

This U.S. non-provisional patent application claims priority under 35 U.S.C. § 119 to Korean Patent Application No. 10-2019-0099426, filed on Aug. 14, 2019 in the Korean Intellectual Property Office, the disclosure of which is incorporated by reference herein in its entirety.

TECHNICAL FIELD

Exemplary embodiments of the inventive concept relate to a display device having improved reliability, where the display device includes an input sensing panel having an island pattern.

DISCUSSION OF RELATED ART

A display device includes a display panel for displaying an image and an input sensing panel for sensing an external input. The input sensing panel is integrally formed with the display panel through successive processes. Alternatively, the input sensing panel is coupled to the display panel after being formed through a separate process from the display panel.

SUMMARY

According to an exemplary embodiment of the inventive concept, a display device includes a display panel including first light emitting areas, second light emitting areas, and third light emitting areas, and an input sensing panel disposed on the display panel and including a first sensing electrode and a second sensing electrode. The first sensing electrode includes first sensing patterns and at least one first connection pattern connecting two first sensing patterns adjacent to each other among the first sensing patterns. The second sensing electrode includes second sensing patterns, at least one island pattern disposed between two second sensing patterns adjacent to each other among the second sensing patterns, and second connection patterns connecting the second sensing patterns and the at least one island pattern. Each side of the at least one island pattern is substantially parallel to at least one side of each of the second sensing patterns.

An opening is formed between the at least one island pattern and the at least one first connection pattern, and the third light emitting areas exposed through the opening have substantially the same size as one another in a plan view.

The second connection patterns do not overlap the third light emitting areas in a plan view.

The third light emitting areas are green light emitting areas.

The at least one island pattern includes a first island pattern and a second island pattern having a symmetrical shape with respect to the first island pattern about an axis extending in a first direction and spaced apart from the first island pattern in a second direction crossing the first direction.

A number of the second connection patterns connected to the first island pattern is four, and a number of the second connection patterns connected to the second island pattern is four.

The at least one island pattern further includes a third island pattern disposed between the first island pattern and the second island pattern.

A second connection pattern connected to the third island pattern among the second connection patterns is substantially parallel to the first direction.

The second sensing electrode further includes an electrostatic discharge pattern connected to the second sensing patterns, and the electrostatic discharge pattern is disposed on a same layer as the second connection patterns.

The electrostatic discharge pattern does not overlap the third light emitting areas in a plan view.

The input sensing panel further includes dummy patterns disposed between the first sensing patterns and the second sensing patterns.

The each side of the at least one island pattern is substantially parallel to at least one side of the dummy patterns.

The at least one first connection pattern is disposed on a layer different from a layer on which the second connection patterns are disposed.

The first sensing electrode is disposed on the display panel, and the second connection patterns are disposed on the first sensing electrode.

A number of the second connection patterns connected to the at least one island pattern is four.

According to an exemplary embodiment of the inventive concept, a display device includes a display panel including first light emitting areas, second light emitting areas, and third light emitting areas, and an input sensing panel disposed on the display panel. The input sensing panel includes first sensing patterns disposed on the display panel, at least one first connection pattern disposed on the display panel and connecting two first sensing patterns adjacent to each other among the first sensing patterns, second sensing patterns disposed on the display panel, at least one island pattern disposed on the display panel, disposed between two second sensing patterns adjacent to each other among the second sensing patterns, and surrounded by the at least one first connection pattern, and second connection patterns disposed on the first sensing pattern and connecting the second sensing patterns and the at least one island pattern. The second connection patterns do not overlap the third light emitting areas in a plan view.

The at least one first connection pattern is disposed on a layer different from a layer on which the second connection patterns are disposed.

Each side of the at least one island pattern is substantially parallel to at least one side of the second sensing patterns.

A number of the second connection patterns connected to the at least one island pattern is four.

The third light emitting areas are green light emitting areas.

BRIEF DESCRIPTION OF THE DRAWINGS

The above and other features of the inventive concept will become readily apparent by describing in detail exemplary embodiments thereof with reference to the accompanying drawings.

DETAILED DESCRIPTION OF THE EMBODIMENTS

Figure 1:
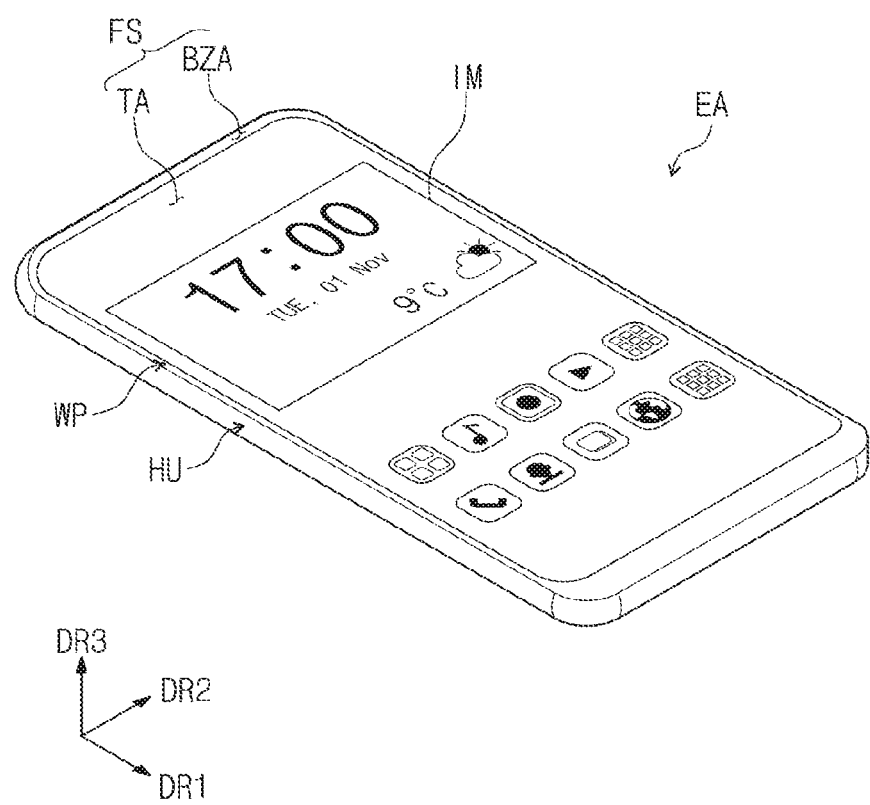
FIG. 1 is a perspective view showing a display device according to an exemplary embodiment of the inventive concept.

Exemplary embodiments of the inventive concept provide a display device having improved reliability.

Exemplary embodiments of the inventive concept will be described more fully hereinafter with reference to the accompanying drawings. Like reference numerals may refer to like elements throughout this application.

It will be understood that when an element or layer is referred to as being "on", "connected to", or "coupled to" another element or layer, it can be directly on, connected, or coupled to the other element or layer, or intervening elements or layers may be present.

In the drawings, the thickness, ratio, and dimension of components may be exaggerated for convenience of description.

As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the inventive concept. As used herein, the singular forms, "a", "an", and "the" are intended to include the plural forms as well, unless the context clearly indicates otherwise.

Spatially relative terms, such as "beneath", "below", "lower", "above", "upper", and the like, may be used herein for ease of description to describe one element or feature's relationship to another element(s) or feature(s) as illustrated in the drawings.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Figure 2:
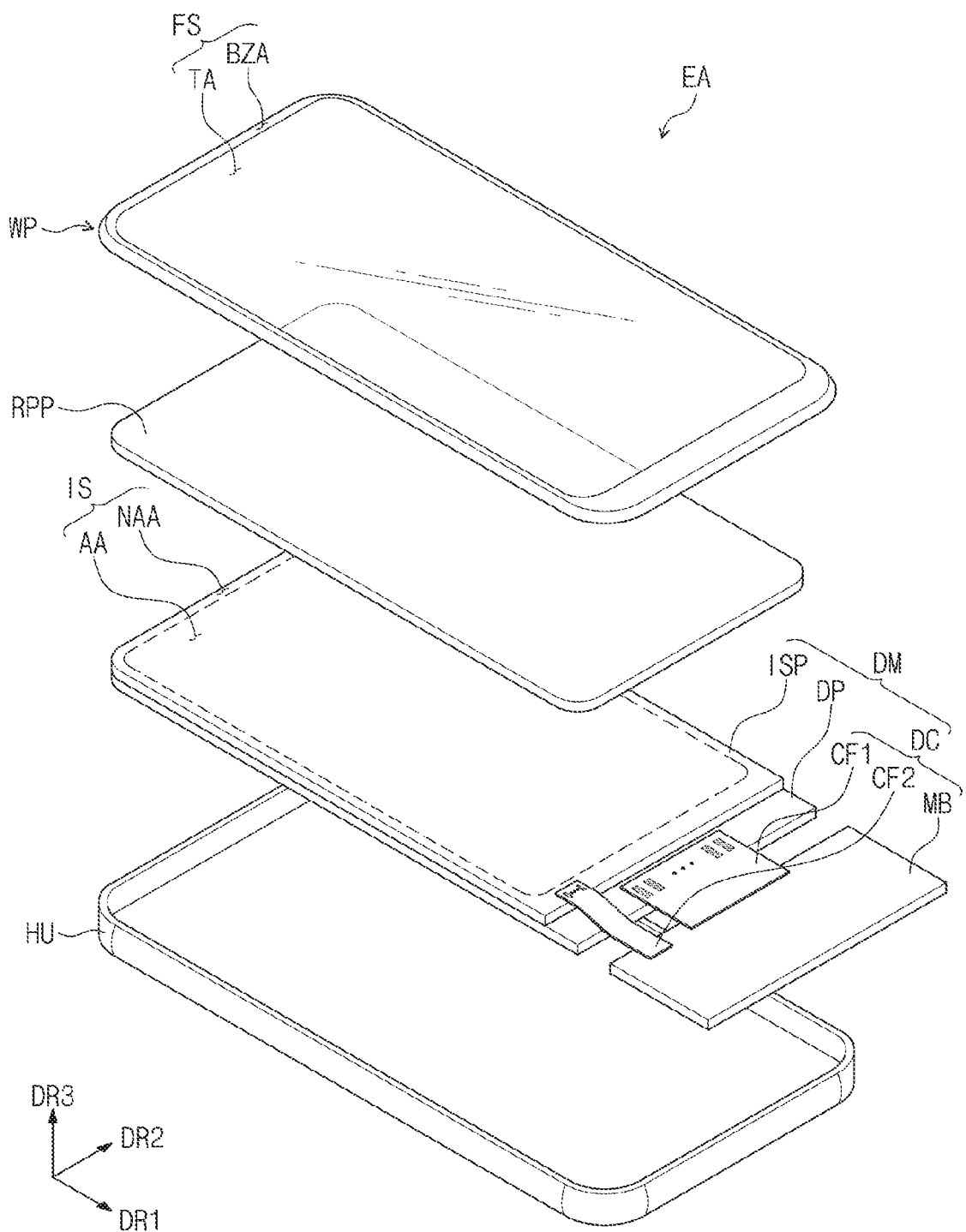
FIG. 2 is an exploded perspective view showing the display device of FIG. 1 according to an exemplary embodiment of the inventive concept.

FIG. 1 is a perspective view showing a display device according to an exemplary embodiment of the inventive concept, and FIG. 2 is an exploded perspective view showing the display device of FIG. 1 according to an exemplary embodiment of the inventive concept.

Referring to FIGS. 1 and 2, a display device EA may be a device activated in response to an electrical signal. The display device EA may include various exemplary embodiments. For example, the display device EA may be applied to a large-sized electronic item, such as a television set, a monitor, or an outdoor billboard, or a small or medium-sized electronic item, such as a personal computer, a notebook computer, a personal digital assistants, a navigation unit, a game unit, a mobile electronic device, or a camera. These are merely exemplary, and thus, the display device EA may be applied to other electronic devices. In the present exemplary embodiment, a smartphone will be described as a representative example of the display device EA.

The display device EA displays an image IM through a display surface FS, which is substantially parallel to each of a first direction DR1 and a second direction DR2 crossing the first direction DR1, toward a third direction DR3 crossing both the first and second direction DR1 and DR2. The image IM includes a still image as well as a motion image. FIG. 1 shows a clock application and application icons as a representative example of the image IM. The display surface FS through which the image IM is displayed corresponds to a front surface of the display device EA and a front surface of a window panel WP.

In the present exemplary embodiment, front (or upper) and rear (or lower) surfaces of each member of the display device EA are defined with respect to a direction in which the image IM is displayed. The front and rear surfaces face each other in the third direction DR3, and a normal line direction of each of the front and rear surfaces is substantially parallel to the third direction DR3. Meanwhile, directions indicated by the first, second, and third directions DR1, DR2, and DR3 are relative to each other, and thus the directions indicated by the first, second, and third directions DR1, DR2, and DR3 may be changed to other directions. In the following descriptions, the expression "when viewed in a plan view" may mean a state of being viewed in the third direction DR3.

The display device EA includes the window panel WP, an anti-reflective panel RPP, a display module DM, and a housing HU. In the present exemplary embodiment, the window panel WP and the housing HU are coupled to each other to provide an exterior of the display device EA.

The window panel WP includes an optically transparent insulating material. For example, the window panel WP includes a glass or plastic material. The window panel WP has a single-layer or multi-layer structure. As an example, the window panel WP includes a plurality of plastic films attached to one another by an adhesive, or a glass substrate and a plastic film attached to the glass substrate by an adhesive.

The display surface FS of the window panel WP defines the front surface of the display device EA as described above. A transmissive area TA may be an optically transparent area. For example, the transmissive area TA may be an area having a visible light transmittance of about 90% or more.

A bezel area BZA may be an area having a relatively lower transmittance as compared with the transmissive area TA. The bezel area BZA defines a shape of the transmissive area TA. The bezel area BZA is disposed adjacent to the transmissive area TA and surrounds the transmissive area TA.

The bezel area BZA has a predetermined color. The bezel area BZA covers a peripheral area NAA of the display module DM to prevent the peripheral area NAA from being viewed from the outside. However, this is merely exemplary, and the bezel area BZA may be omitted from the window panel WP according to the exemplary embodiment of the inventive concept.

The anti-reflective panel RPP is disposed under the window panel WP. The anti-reflective panel RPP reduces a reflectance of an external light incident thereto from above the window panel WP. In the present exemplary embodiment, the anti-reflective panel RPP may be omitted or may be included in the display module DM.

The display module DM displays the image IM and senses an external input. The display module DM includes a front surface IS in which an active area AA and the peripheral area NAA are defined. The active area AA may be an area activated in response to an electrical signal.

In the present exemplary embodiment, the active area AA is an area through which the image IM is displayed and the external input is sensed. The transmissive area TA overlaps at least the active area AA. For example, the transmissive area TA overlaps an entire surface or at least a portion of the active area AA. Accordingly, a user perceives the image IM or provides the external input through the transmissive area TA; however, this is merely exemplary. In other words, an area through which the image IM is displayed and an area through which the external input is sensed may be separated from each other in the active area AA, but the inventive concept is not limited thereto.

The peripheral area NAA may be covered by the bezel area BZA. The peripheral area NAA may be disposed adjacent to the active area AA. The peripheral area NAA may surround the active area AA. A driving circuit or a driving line may be disposed in the peripheral area NAA to drive the active area AA.

The display module DM includes a display panel DP, an input sensing panel ISP, and a driving circuit DC.

The display panel DP includes configurations appropriate to generate the image IM. The image IM generated by the display panel DP is perceived outside by the user through the transmissive area TA.

The input sensing panel ISP senses the external input applied from the outside. As described above, the input sensing panel ISP senses the external input applied to the window panel WP.

The driving circuit DC is electrically connected to the display panel DP and the input sensing panel ISP. The driving circuit DC includes a main circuit board MB, a first circuit board CF1, and a second circuit board CF2.

The first circuit board CF1 is electrically connected to the display panel DP. The first circuit board CF1 connects the display panel DP and the main circuit board MB. In the present exemplary embodiment, a flexible circuit film is shown as the first circuit board CF1; however, this is merely exemplary. The first circuit board CF1 may not be connected to the main circuit board MB and may be a rigid board.

The first circuit board CF1 is connected to pads (display pads) of the display panel DP, which are disposed in the peripheral area NAA. The first circuit board CF1 provides electrical signals to the display panel DP to drive the display panel DP. The electrical signals are generated by the first circuit board CF1 or the main circuit board MB.

The second circuit board CF2 is electrically connected to the input sensing panel ISP. The second circuit board CF2 connects the input sensing panel ISP and the main circuit board MB. In the present exemplary embodiment, a flexible circuit film is shown as the second circuit board CF2; however, this is merely exemplary. The second circuit board CF2 may not be connected to the main circuit board MB and may be a rigid board.

The second circuit board CF2 is connected to pads (sensing pads) of the input sensing panel ISP, which are disposed in the peripheral area NAA. The second circuit board CF2 provides electrical signals to the input sensing panel ISP to drive the input sensing panel ISP. The electrical signals are generated by the second circuit board CF2 or the main circuit board MB.

The main circuit board MB includes various driving circuits to drive the display module DM and a connector to provide a power. The first and second circuit boards CF1 and CF2 are connected to the main circuit board MB. According to an exemplary embodiment of the inventive concept, the display module DM is easily controlled by using one main circuit board MB; however, this is merely exemplary. In the display module DM according to an exemplary embodiment of the inventive concept, the display panel DP and the input sensing panel ISP may be connected to different main circuit boards, and one of the first and second circuit boards CF1 and CF2 may not be connected to the main circuit board MB; however, the inventive concept is not limited thereto.

The housing HU is coupled to the window panel WP. The housing HU is coupled to the window panel WP to provide a predetermined inner space therein. The display module DM is accommodated in the predetermined inner space.

The housing HU has a material with a relatively high rigidity. For example, the housing HU includes a glass, plastic, or metal material, a plurality of frames, and/or plates of combinations thereof. The housing HU stably protects the components of the display device EA accommodated in the predetermined inner space from external impacts.

Figure 3A:
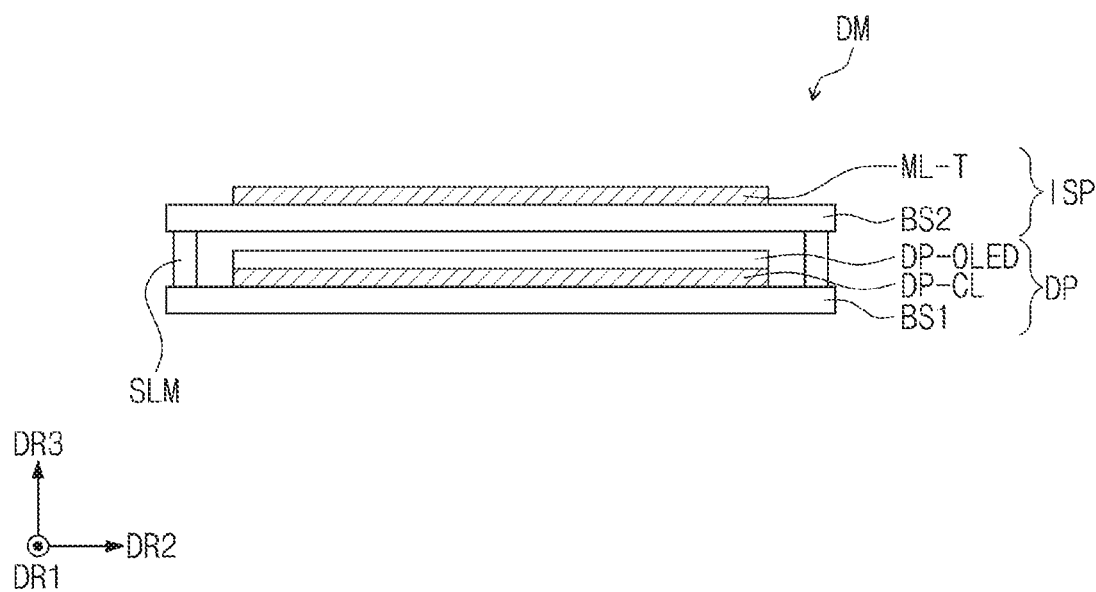
FIG. 3A is a cross-sectional view showing a display module of FIG. 2 according to an exemplary embodiment of the inventive concept.

FIG. 3A is a cross-sectional view showing a display module of FIG. 2 according to an exemplary embodiment of the inventive concept.

Referring to FIG. 3A, the display module DM includes the display panel DP, the input sensing panel ISP, and a coupling member SLM.

The display panel DP includes a first base layer BS1, a display circuit layer DP-CL, and an image display layer DP-OLED. The input sensing panel ISP includes a second base layer BS2 and a sensing circuit layer ML-T.

Each of the first base layer BS1 and the second base layer BS2 may be a silicon substrate, a plastic substrate, a glass substrate, an insulating film, or a stack structure including a plurality of insulating layers.

The display circuit layer DP-CL is disposed on the first base layer BS1. The display circuit layer DP-CL includes a plurality of insulating layers, a plurality of conductive layers, and a semiconductor layer. The conductive layers of the display circuit layer DP-CL form signal lines or a pixel control circuit.

The image display layer DP-OLED is disposed on the display circuit layer DP-CL. The image display layer DP-OLED includes organic light emitting diodes; however, the inventive concept is not limited thereto. The image display layer DP-OLED according to an exemplary embodiment of the inventive concept may include inorganic light emitting diodes, organic-inorganic light emitting diodes, or a liquid crystal layer.

The second base layer BS2 is disposed on the image display layer DP-OLED. A predetermined space is defined between the second base layer BS2 and the image display layer DP-OLED. The space is filled with air or an inert gas. In addition, the predetermined space may be filled with a filler such as a silicone-based polymer, an epoxy-based resin, or an acrylic-based resin.

The sensing circuit layer ML-T is disposed on the second base layer BS2. The sensing circuit layer ML-T includes a plurality of insulating layers and a plurality of conductive layers. The conductive layers form sensing electrodes that sense the external input, sensing lines that are electrically connected to the sensing electrodes, and sensing pads that are electrically connected to the sensing lines. This will be described in detail below.

The coupling SLM is disposed between the first base layer BS1 and the second base layer BS2. The coupling member SLM combines the first base layer BS1 and the second base layer BS2. The coupling member SLM includes an organic material, such as a photo-curable resin or a photo-plastic resin, or includes an inorganic material, such as a frit seal; however, the inventive concept is not limited thereto.

Figure 3B:
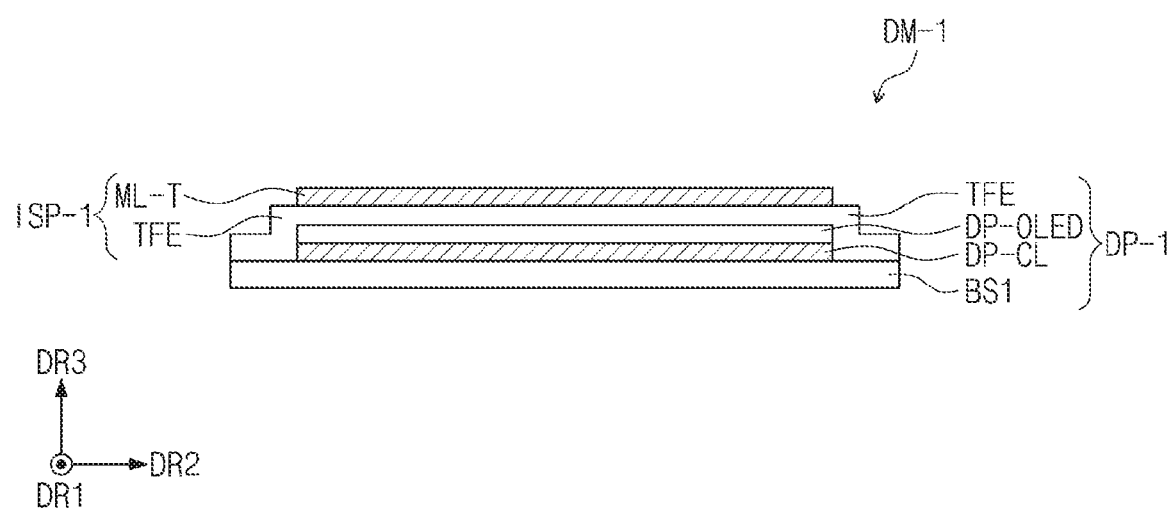
FIG. 3B is a cross-sectional view showing the display module of FIG. 2 according to an exemplary embodiment of the inventive concept.

FIG. 3B is a cross-sectional view showing the display module of FIG. 2 according to an exemplary embodiment of the inventive concept.

Referring to FIG. 3B, a display module DM-1 includes a display panel DP-1 and an input sensing panel ISP-1. The input sensing panel ISP-1 may be referred to as an "input sensing layer".

The display panel DP-1 includes the first base layer BS1, the display circuit layer DP-CL, the image display layer DP-OLED, and a thin film encapsulation layer TFE. The input sensing panel ISP-1 includes a second base layer TFE and the sensing circuit layer ML-T. The thin film encapsulation layer TFE and the second base layer TFE may be substantially the same as each other.

According to an exemplary embodiment of the inventive concept, the display panel DP-1 and the input sensing panel ISP-1 may be formed through successive processes. In other words, the sensing circuit layer ML-T is directly formed on the thin film encapsulation layer TFE.

Figure 4:
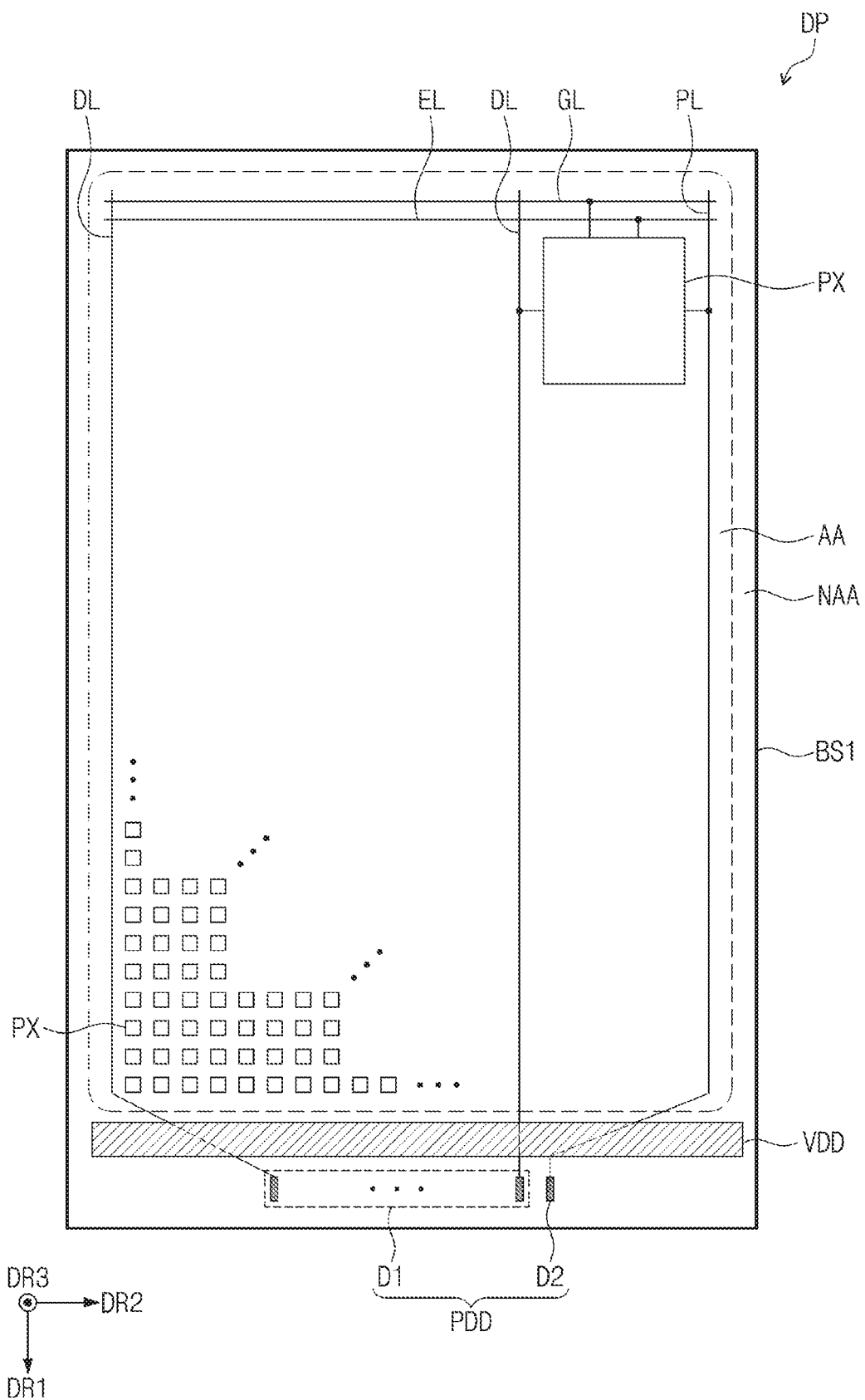
FIG. 4 is a plan view showing a display panel of FIG. 2 according to an exemplary embodiment of the inventive concept.

FIG. 4 is a plan view showing a display panel of FIG. 2 according to an exemplary embodiment of the inventive concept.

Referring to FIG. 4, the display panel DP may include a plurality of pixels PX, a plurality of signal lines GL, DL, PL, and EL, and a plurality of display pads PDD.

The active area AA of the display panel DP is the area through which the image is displayed, and the peripheral area NAA is the area in which the driving circuit or the driving line is disposed. FIG. 4 shows the active area AA and the peripheral area NAA of the display panel DP. The pixels PX are arranged in the active area AA.

The signal lines GL, DL, PL, and EL are connected to the pixels PX to transmit the electrical signals to the pixels PX. Among the signal lines included in the display panel DP, a scan line GL, a data line DL, a power line PL, and a light emitting control line EL are shown as a representative example; however, these are merely exemplary. The signal lines GL, DL, PL, and EL may further include an initialization voltage line and should not be limited thereto.

A power pattern VDD is disposed in the peripheral area NAA. In an exemplary embodiment of the inventive concept, the power pattern VDD is connected to a plurality of power lines PL. Accordingly, as the display panel DP includes the power pattern VDD, the pixels PX may receive the same first power supply signal.

The display pads PDD include a first pad D1 and a second pad D2. The first pad D1 is provided in a plural number, and the first pads D1 are respectively connected to a plurality of data lines DL. The second pad D2 is connected to the power pattern VDD to be electrically connected to the power line PL. The display panel DP applies the electrical signals, which are provided from the outside through the display pads PDD, to the pixels PX. Meanwhile, the display pads PDD may further include pads to receive other electrical signals in addition to the first and second pads D1 and D2, and should not be limited to a particular exemplary embodiment.

Figure 5:
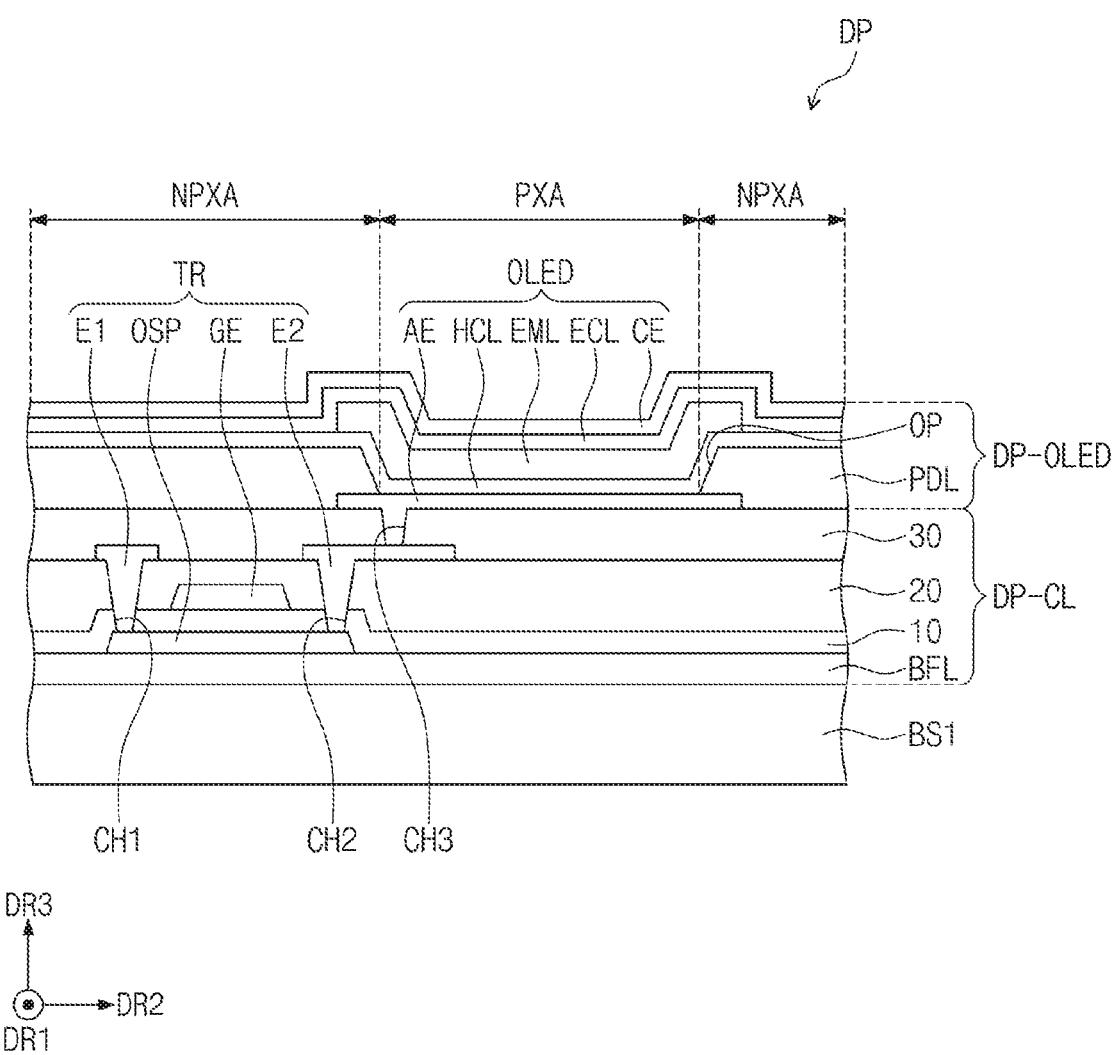
FIG. 5 is a cross-sectional view showing the display panel of FIG. 4 according to an exemplary embodiment of the inventive concept.

FIG. 5 is a cross-sectional view showing the display panel of FIG. 4 according to an exemplary embodiment of the inventive concept.

Referring to FIGS. 4 and 5, the pixels PX may include a plurality of transistors, a capacitor, and a light emitting element OLED. FIG. 5 shows one transistor TR and the light emitting element OLED.

The display circuit layer DP-CL and the image display layer DP-OLED may be sequentially disposed on the first base layer BS1.

The display circuit layer DP-CL may include the signal lines GL, DL, PL, and EL. The display circuit layer DP-CL may include a buffer layer BFL that is an inorganic layer, a first intermediate inorganic layer 10, a second intermediate inorganic layer 20, and an intermediate organic layer 30 that is an organic layer. Materials for the inorganic layer and the organic layer should not be particularly limited.

The buffer layer BFL may provide a flat surface on the first base layer BS1 and may prevent infiltration of impurities in the first base layer BS1. In an exemplary embodiment of the inventive concept, the buffer layer BFL may be selectively arranged or omitted.

A semiconductor pattern OSP of the transistor TR may be disposed on the buffer layer BFL. The semiconductor pattern OSP may include polysilicon or amorphous silicon. In addition, the semiconductor pattern OSP may include a metal oxide semiconductor.

The first intermediate inorganic layer 10 may be disposed on the semiconductor pattern OSP. A control electrode GE of the transistor TR may be disposed on the first intermediate inorganic layer 10.

The second intermediate inorganic layer 20 may be disposed on the first intermediate inorganic layer 10 to cover the control electrode GE. A first electrode E1 and a second electrode E2 of the transistor TR may be disposed on the second intermediate inorganic layer 20.

The first electrode E1 and the second electrode E2 may be connected to the semiconductor pattern OSP through a first contact hole CH1 and a second contact hole CH2, respectively, formed in the first intermediate inorganic layer 10 and the second intermediate inorganic layer 20. According to an exemplary embodiment of the inventive concept, the transistor TR may be implemented with a bottom gate structure.

The intermediate organic layer 30 may be disposed on the second intermediate inorganic layer 20 to cover the first electrode E1 and the second electrode E2. The intermediate organic layer 30 may provide a flat surface.

The image display layer DP-OLED may be disposed on the intermediate organic layer 30. The image display layer DP-OLED may include a pixel definition layer PDL and the light emitting element OLED. For example, the light emitting element OLED may include an organic light emitting diode. The pixel definition layer PDL may include an organic material.

A first electrode AE of the light emitting element OLED may be disposed on the intermediate organic layer 30. The first electrode AE may be electrically connected to the second electrode E2 via a third contact hole CH3 formed in the intermediate organic layer 30.

An opening OP may be formed in the pixel definition layer PDL. At least a portion of the first electrode AE may be exposed through the opening OP of the pixel definition layer PDL.

A hole control layer HCL of the light emitting element OLED may be commonly disposed in a light emitting area PXA and a non-light emitting area NPXA. A light emitting layer EML of the light emitting element OLED may be disposed on the hole control layer HCL. The light emitting layer EML may be disposed in an area corresponding to the opening OP. The light emitting layer EML may include an organic material and/or an inorganic material. The light emitting layer EML may emit light having a predetermined color.

An electron control layer ECL of the light emitting element OLED may be disposed on the light emitting layer EML. A second electrode CE of the light emitting element OLED may be disposed on the electron control layer ECL.

Figure 6:
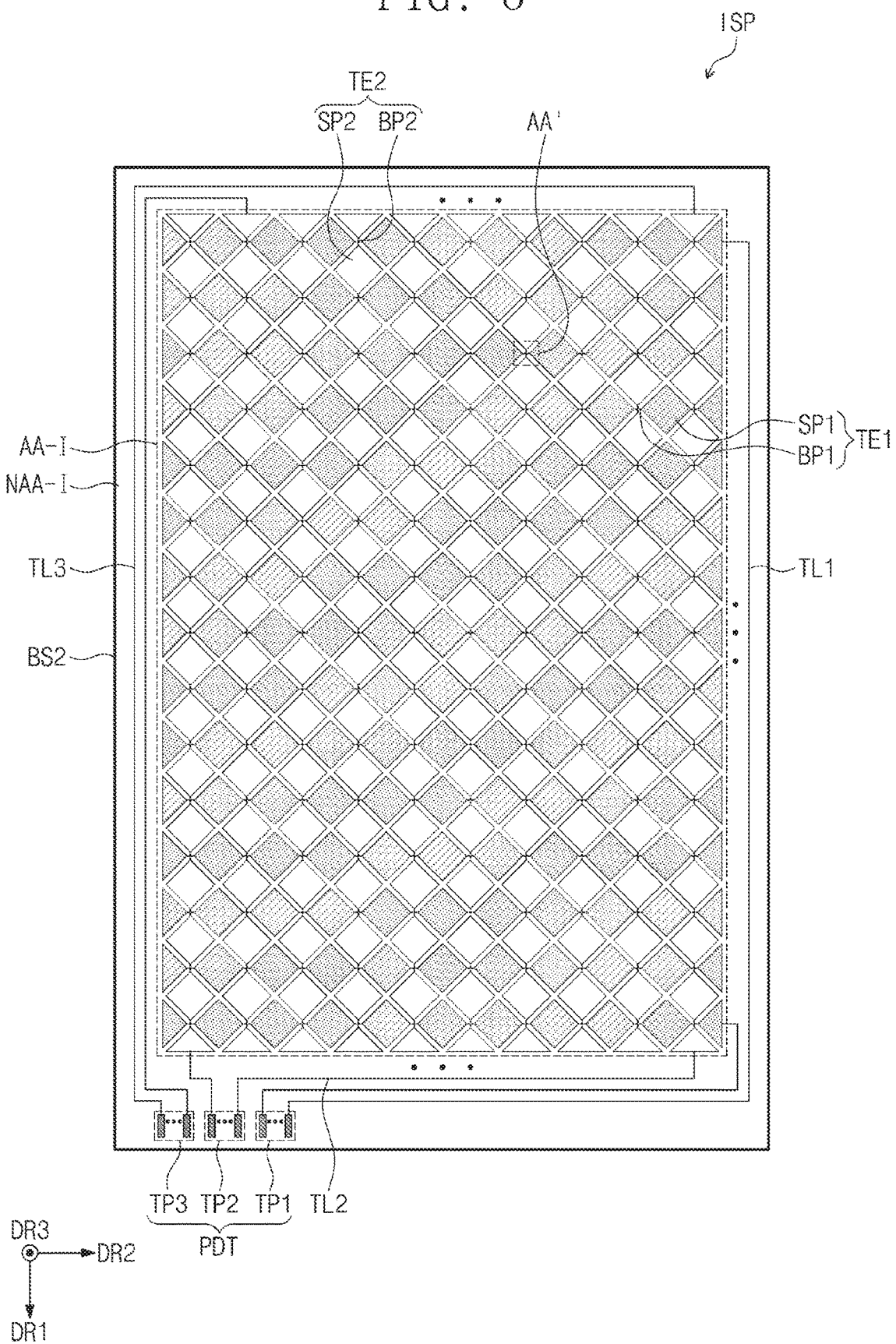
FIG. 6 is a plan view showing an input sensing panel of FIG. 2 according to an exemplary embodiment of the inventive concept.

FIG. 6 is a plan view showing an input sensing panel of FIG. 2 according to an exemplary embodiment of the inventive concept.

Referring to FIG. 6, the input sensing panel ISP may include the second base layer BS2, a plurality of sensing electrodes TE1 and TE2, a plurality of sensing lines TL1, TL2, and TL3, and a plurality of sensing pads PDT. The sensing electrodes TE1 and TE2, the sensing lines TL1, TL2, and TL3, and the sensing pads PDT may form the sensing circuit layer ML-T (refer to FIG. 3).

The second base layer BS2 may include an active area AA-I and a peripheral area NAA-I adjacent to the active area AA-I, which are defined therein. The peripheral area NAA-I may surround the active area AA-I.

The sensing electrodes TE1 and TE2 may include a first sensing electrode TE1 and a second sensing electrode TE2. The first sensing electrode TE1 and the second sensing electrode TE2 may be disposed above the active area AA-I. The input sensing panel ISP may obtain information on the external input depending on a variation in capacitance between the first sensing electrode TE1 and the second sensing electrode TE2.

The first sensing electrode TE1 may include first sensing patterns SP1 and first connection patterns BP1. At least one first connection pattern BP1 may be connected to two first sensing patterns SP1 adjacent to each other. The second sensing electrode TE2 may include second sensing patterns SP2, second connection patterns BP2, and island patterns ILP1 and ILP2 (refer to FIG. 7). At least one second connection pattern BP2 may be connected to two second sensing patterns SP2 adjacent to each other.

The sensing lines TL1, TL2, and TL3 may be disposed in the peripheral area NAA-I. The sensing lines TL1, TL2, and TL3 may include a first sensing line TL1, a second sensing line TL2, and a third sensing line TL3.

The first sensing line TL1 may be connected to the first sensing electrode TEL The second sensing line TL2 may be connected to one end of the second sensing electrode TE2. The third sensing line TL3 may be connected to the other end of the second sensing electrode TE2. The other end of the second sensing electrode TE2 may be opposite to the one end of the second sensing electrode TE2.

According to an exemplary embodiment of the inventive concept, the second sensing electrode TE2 may be connected to the second sensing line TL2 and the third sensing line TL3. Accordingly, even though the second sensing electrode TE2 has a length longer than that of the first sensing electrode TE1, a sensitivity of the second sensing electrode TE2 may be uniformly maintained throughout the entire area of the second sensing electrode TE2. However, this is merely exemplary. The third sensing line TL3 may be omitted, and should not be limited to a particular exemplary embodiment.

The sensing pads PDT may be disposed in the peripheral area NAA-I. The sensing pads PDT may include a first sensing pad TP1, a second sensing pad TP2, and a third sensing pad TP3. The first sensing pad TP1 may be connected to the first sensing line TL1 and electrically connected to the first sensing electrode TE1. The second sensing pad TP2 may be connected to the second sensing line TL2, and the third sensing pad TP3 may be connected to the third sensing line TL3. Therefore, the second sensing pad TP2 and the third sensing pad TP3 may be electrically connected to the second sensing electrode TE2.

The first sensing line TL1 may have a first width smaller than a second width of the first sensing pad TP1, the second sensing line TL2 may have a first width smaller than a second width of the second sensing pad TP2, and the third sensing line TL3 may have a first width smaller than a second width of the third sensing pad TP3.

Figure 7:
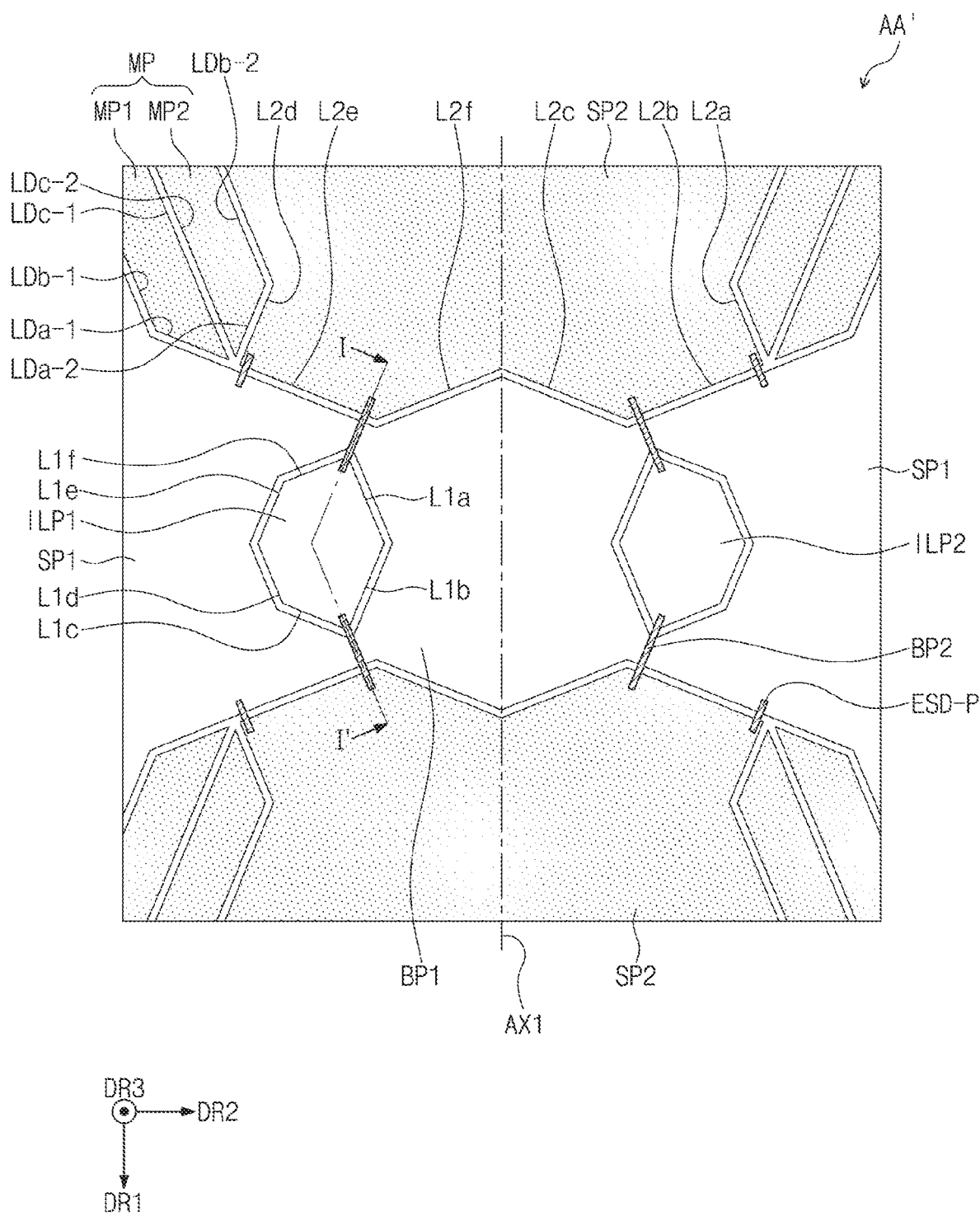
FIG. 7 is a plan view showing a portion AA' of FIG. 6 according to an exemplary embodiment of the inventive concept.
Figure 8:
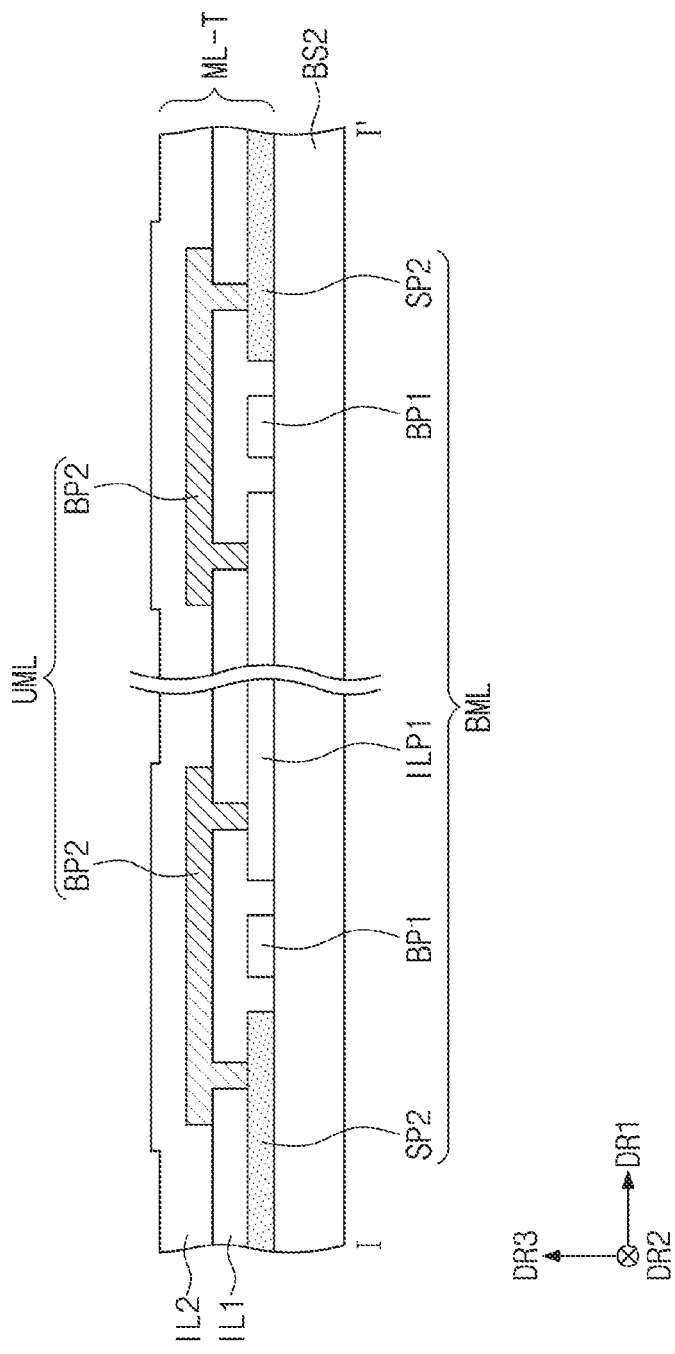
FIG. 8 is a cross-sectional view taken along a line I-I' shown in FIG. 7 according to an exemplary embodiment of the inventive concept.

FIG. 7 is a plan view showing a portion AA' of FIG. 6 according to an exemplary embodiment of the inventive concept, and FIG. 8 is a cross-sectional view taken along a line I-I' shown in FIG. 7 according to an exemplary embodiment of the inventive concept.

Referring to FIGS. 7 and 8, the sensing circuit layer ML-T may be disposed on the second base layer BS2. The sensing circuit layer ML-T may include a first conductive layer BML, a first insulating layer IL1 disposed on the first conductive layer BML, a second conductive layer UML disposed on the first insulating layer IL1, and a second insulating layer IL2 disposed on the second conductive layer UML.

The first conductive layer BML may include a transparent conductive material. In the following descriptions, the term "transparent" may mean that the transmittance of light is greater than or equal to a predetermined reference. For example, the predetermined reference may be about 90% or more; however, the inventive concept is not limited thereto. The first conductive layer BML may include a transparent conductive oxide, for example, at least one of indium tin oxide (ITO), indium zinc oxide (IZO), indium gallium oxide (IGO), indium gallium zinc oxide (IGZO), or mixtures/compounds thereof; however, the inventive concept is not limited thereto.

The first conductive layer BML may include the first sensing patterns SP1, the first connection patterns BP1, the second sensing patterns SP2, and the island patterns ILP1 and ILP2. The island patterns ILP1 and ILP2 may be insulated from the first sensing patterns SP1 and the first connection patterns BP1, and may be electrically connected to the second sensing patterns SP2. The island patterns ILP1 and ILP2 may include a first island pattern ILP1 and a second island pattern ILP2.

The first island pattern ILP1 may have a hexagonal shape; however, this is merely exemplary. The first island pattern ILP1 may have a variety of shapes.

The first island pattern ILP1 may include first, second, third, fourth, fifth, and sixth sides L1a, L1b, L1c, L1d, L1e, and L1f. Each of the second sensing patterns SP2 may include first, second, third, fourth, fifth, and sixth sides L2a, L2b, L2c, L2d, L2e, and L2f.

The first side L1a and the fourth side L1d of the first island pattern ILP1 may be substantially parallel to the first side L2a of each of the second sensing patterns SP2. The second side L1b and the fifth side L1e of the first island pattern ILP1 may be substantially parallel to the fourth side L2d of each of the second sensing patterns SP2. The third side L1c of the first island pattern ILP1 may be substantially parallel to the third side L2c and the fifth side L2e of each of the second sensing patterns SP2. The sixth side L1f of the first island pattern ILP1 may be substantially parallel to the second side L2b and the sixth side L2f of each of the second sensing patterns SP2.

The second island pattern ILP2 may have a shape that is symmetrical with respect to the first island pattern ILP1 about a first axis AX1 extending in the first direction DR1. The second island pattern ILP2 may be spaced apart from the first island pattern ILP1 in the second direction DR2.

According to an exemplary embodiment of the inventive concept, each side of the first island pattern ILP1 and the second island pattern ILP2 may be substantially parallel to at least one side of each of the second sensing patterns SP2. The first and second island patterns ILP1 and ILP2 may maintain periodic characteristics of the pattern of the first sensing electrode TE1 and the second sensing electrode TE2. When viewed in a plan view, the periodic characteristics between the pattern of the first sensing electrode TE1 and the second sensing electrode TE2 and the pattern of the non-light emitting area NPXA of the display panel DP (refer to FIG. 5) is not changed, and thus a moiré phenomenon may be prevented. As a result, a visibility of the display device EA (refer to FIG. 1) may be improved.

The first conductive layer BML may further include dummy patterns MP. The dummy patterns MP may be formed through the same process as the first sensing patterns SP1 and the second sensing patterns SP2, and thus, the dummy patterns MP may include the same material as and may have the same stack structure as the first sensing patterns SP1 and the second sensing patterns SP2. The dummy patterns MP may be floating electrodes, and thus may not be electrically connected to the first sensing patterns SP1 and the second sensing patterns SP2. As the dummy patterns MP are arranged, a visibility of a boundary area between the first sensing patterns SP1 and the second sensing patterns SP2 may be reduced. The dummy patterns MP may include a first dummy pattern MP1 and a second dummy pattern MP2.

The first dummy pattern MP1 may be disposed adjacent to each of the first sensing patterns SP1. The first dummy pattern MP1 may include first, second, and third sides LDa-1, LDb-1, and LDc-1. The first side LDa-1 of the first dummy pattern MP1 may be substantially parallel to the third side L2c and the fifth side L2e of each of the second sensing patterns SP2. The first side LDa-1 of the first dummy pattern MP1 may also be substantially parallel to the third side L1c of the first island pattern ILP1. The second side LDb-1 and the third side LDc-1 of the first dummy pattern MP1 may be substantially parallel to each other. The second side LDb-1 and the third side LDc-1 of the first dummy pattern MP1 may be substantially parallel to the first side L2a of each of the second sensing patterns SP2. The second side LDb-1 and the third side LDc-1 of the first dummy pattern MP1 may also be substantially parallel to the first side L1a and the fourth side L1d of the first island pattern ILP1.

The second dummy pattern MP2 may be disposed adjacent to each of the second sensing patterns SP2. The second dummy pattern MP2 may be spaced apart from the first dummy pattern MP1. The second dummy pattern MP2 may include first, second, and third sides LDa-2, LDb-2, and LDc-2. The first side LDa-2 of the second dummy pattern MP2 may be substantially parallel to the fourth side L2d of each of the second sensing patterns SP2. The first side LDa-2 of the second dummy pattern MP2 may also be substantially parallel to the second side L1b and the fifth side L1e of the first island pattern ILP1. The second side LDb-2 and the third side LDc-2 of the second dummy pattern MP2 may be substantially parallel to each other. The second side LDb-2 and the third side LDc-2 of the second dummy pattern MP2 may be substantially parallel to the second side LDb-1 and the third side LDc-1 of the first dummy pattern MP1.

Accordingly, the periodic characteristics between the pattern of the dummy patterns MP, the first sensing electrode TE1, and the second sensing electrode TE2 in a plan view and the pattern of the non-light emitting area NPXA of the display panel DP (refer to FIG. 5) in a plan view is not changed, and thus, a moiré phenomenon may be prevented. However, this is merely exemplary, and the dummy patterns may be omitted.

The first insulating layer IL1 may cover the first conductive layer BML. The first insulating layer IL1 may include an inorganic material. The inorganic material may include at least one of silicon oxide, silicon nitride, silicon oxynitride, titanium oxide, or aluminum oxide.

The second conductive layer UML may include an opaque conductive material. For example, the second conductive layer UML may include a metal material, such as molybdenum, silver, titanium, copper, aluminum, or an alloy thereof. The alloy may be, for example, molybdenum niobium.

The second conductive layer UML may include at least one second connection pattern BP2. In the present exemplary embodiment, four second connection patterns BP2 are shown to connect two second sensing patterns SP2; however, the inventive concept is not limited thereto.

In other words, each of the second connection patterns BP2 may be connected to one of the second sensing patterns SP2 and one of the island patterns ILP1 and ILP2. Two second sensing patterns SP2 spaced apart from each other may be electrically connected to each other via the second connection patterns BP2 and the island patterns ILP1 and ILP2.

The second conductive layer UML may further include an electrostatic discharge pattern ESD-P. The electrostatic discharge pattern ESD-P may be formed through the same process as the second connection pattern BP2, and the electrostatic discharge pattern ESD-P may include the same material as and may have the same stack structure as the second connection pattern BP2. FIG. 7 shows four electrostatic discharge patterns ESD-P as a representative example. The electrostatic discharge pattern ESD-P may be connected to each of the second sensing patterns SP2. One end of the electrostatic discharge pattern ESD-P may overlap each of the first sensing patterns SP1. In FIG. 7, the one end of the electrostatic discharge pattern ESD-P has a quadrangular shape; however, the inventive concept is not limited thereto. In other words, the one end of the electrostatic discharge pattern ESD-P may have a vertex shape to easily discharge static electricity. The electrostatic discharge pattern ESD-P may induce the discharge of static electricity to prevent disconnection of the second connection pattern BP2.

The second insulating layer IL2 may cover the second conductive layer UML. The second insulating layer IL2 may include an inorganic material. The inorganic material may include at least one of silicon oxide, silicon nitride, silicon oxynitride, titanium oxide, or aluminum oxide.

Figure 9:
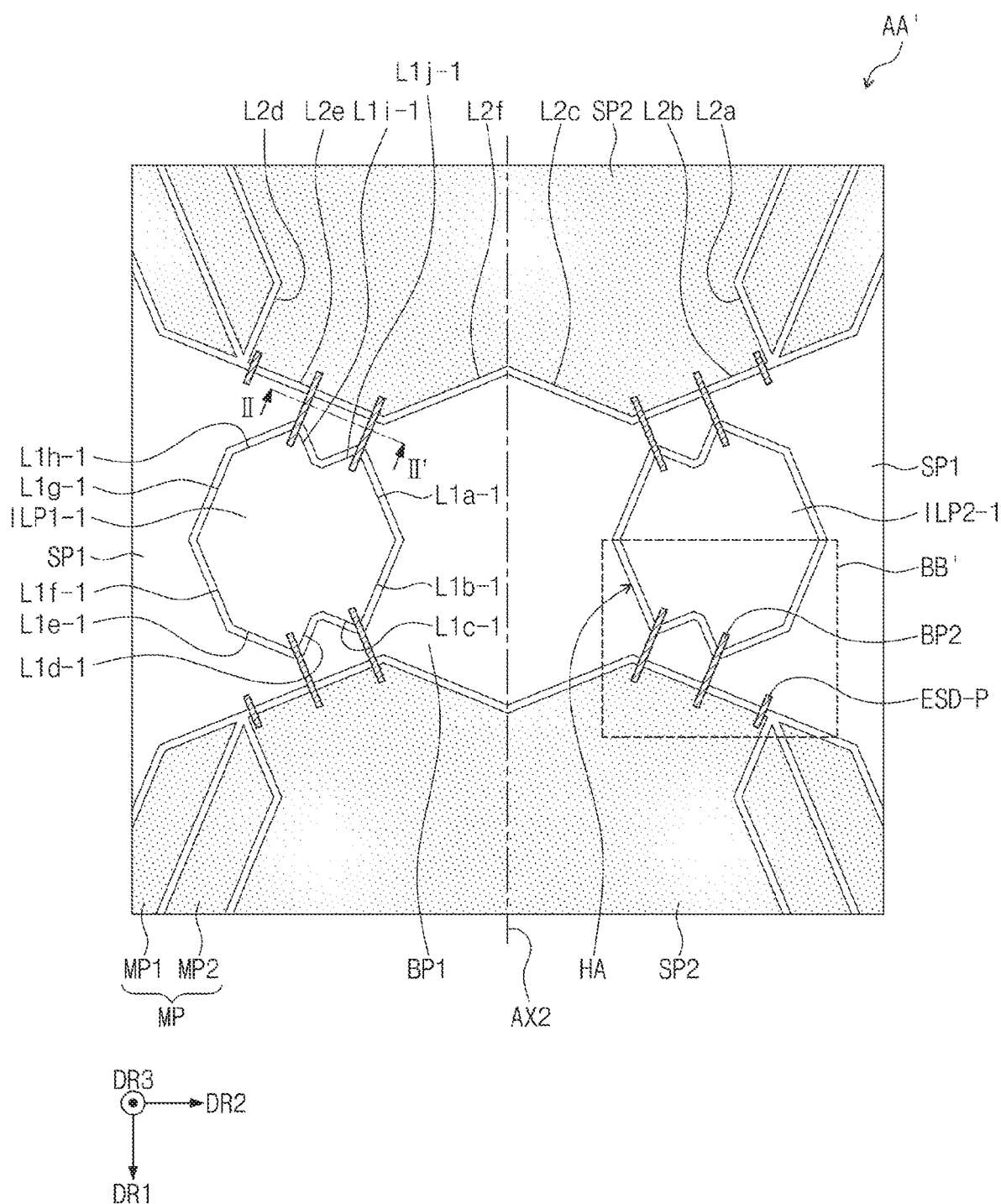
FIG. 9 is a plan view showing the portion AA' of FIG. 6 according to an exemplary embodiment of the inventive concept.

FIG. 9 is a plan view showing the portion AA' of FIG. 6 according to an exemplary embodiment of the inventive concept. In FIG. 9, the same reference numerals denote the same elements shown in FIG. 7, and thus detailed descriptions of the same elements will be omitted.

Referring to FIG. 9, island patterns ILP1-1 and ILP2-1 may be insulated from the first sensing patterns SP1 and the first connection pattern BP1, and may be electrically connected to the second sensing patterns SP2. The island patterns ILP1-1 and ILP2-1 may include a first island pattern ILP1-1 and a second island pattern ILP2-1.

The first island pattern ILP1-1 may have a free-form shape. The first island pattern ILP1-1 may include first, second, third, fourth, fifth, sixth, seventh, eighth, ninth, and tenth sides L1a-1, L1b-1, L1c-1, L1d-1, L1e-1, L1f-1, L1g-1, L1h-1, L1i-1, and L1j-1.

The first side L1a-1, the sixth side L1f-1, and the ninth side L1i-1 of the first island pattern ILP1-1 may be substantially parallel to the first side L2a of each of the second sensing patterns SP2. The second side L1b-1, the fourth side L1d-1, and the seventh side L1g-1 of the first island pattern ILP1-1 may be substantially parallel to the fourth side L2d of each of the second sensing patterns SP2. The third side L1c-1 and the fifth side L1e-1 of the first island pattern ILP1-1 may be substantially parallel to the third side L2c and the fifth side L2e of each of the second sensing patterns SP2. The eighth side L1h-1 and the tenth side L1j-1 of the first island pattern ILP1-1 may be substantially parallel to the second side L2b and the sixth side L2f of each of the second sensing patterns SP2.

The second island pattern ILP2-1 may have a shape that is symmetrical with respect to the first island pattern ILP1-1 about a second axis AX2 extending in the first direction DR1. The second island pattern ILP2-1 may be spaced apart from the first island pattern ILP1-1 in the second direction DR2.

According to an exemplary embodiment the inventive concept, each side of the first island pattern ILP1-1 and the second island pattern ILP2-1 may be substantially parallel to at least one side of each of the second sensing patterns SP2. The first and second island patterns ILP1-1 and ILP2-1 may maintain periodic characteristics of the pattern of the first sensing electrode TE1 and the second sensing electrode TE2. When viewed in a plan view, the periodic characteristics between the pattern of the first sensing electrode TE1 and the second sensing electrode TE2 and the pattern of the non-light emitting area NPXA of the display panel DP (refer to FIG. 5) is not changed, and thus the moiré phenomenon may be prevented. As a result, a visibility of the display device EA (refer to FIG. 1) may be improved.

Each of the first and second island patterns ILP1-1 and ILP2-1 may be connected to at least two pairs of the second connection patterns BP2. In other words, each of the first and second island patterns ILP1-1 and ILP2-1 may be connected to four second connection patterns BP2; however, this is merely exemplary. The number of the second connection patterns BP2 connected to the first and second island patterns ILP1-1 and ILP2-1 should not be limited to four.

According to an exemplary embodiment of the inventive concept, although some portions of the second connection patterns BP2 may be damaged and disconnected due to static electricity introduced from the outside, the second sensing patterns SP2 may be electrically connected to each other by the second connection patterns BP2 that are not damaged. Therefore, the display device EA (refer to FIG. 1) may have improved reliability.

Figure 10:
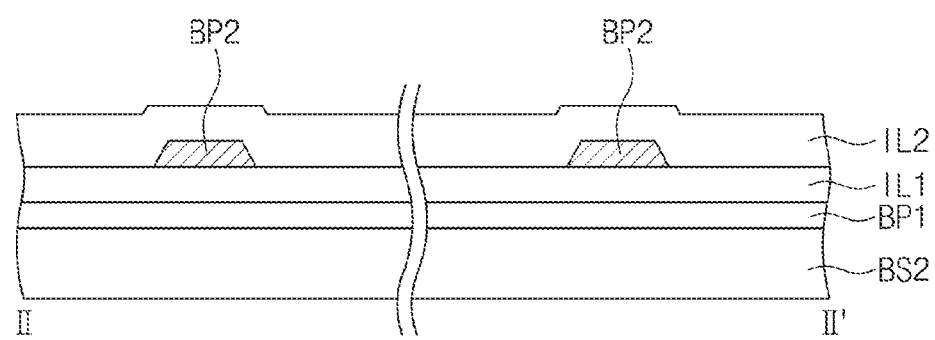
FIG. 10 is a cross-sectional view taken along a line II-II' shown in FIG. 9 according to an exemplary embodiment of the inventive concept.
Figure 10:
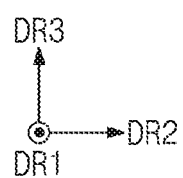

FIG. 10 is a cross-sectional view taken along a line II-II' shown in FIG. 9 according to an exemplary embodiment of the inventive concept.

Referring to FIG. 10, the first connection pattern BP1 may be disposed on the second base layer BS2. The first insulating layer IL1 may be disposed on the first connection pattern BP1. The second connection patterns BP2 may be disposed on the first insulating layer IL1. The second insulating layer IL2 may be disposed on the second connection patterns BP2.

When static electricity is introduced from the outside, the static electricity may be introduced into the second connection patterns BP2. Since each of the second connection patterns BP2 has a small area when viewed in a plan view, the static electricity may flow to the first connection pattern BP1 having a relatively large area. When the static electricity flows to the first connection pattern BP1 from the second connection patterns BP2, it is highly likely that the static electricity damages the second connection patterns BP2.

According to an exemplary embodiment of the inventive concept, although some portions of the second connection patterns BP2 may be damaged and disconnected due the static electricity introduced from the outside, the second sensing patterns SP2 (refer to FIG. 9) may be electrically connected to each other by the second connection patterns BP2 that are not damaged since the second connection patterns BP2 are provided in a plural number. Therefore, the display device EA (refer to FIG. 1) may have improved reliability.

Figure 11:
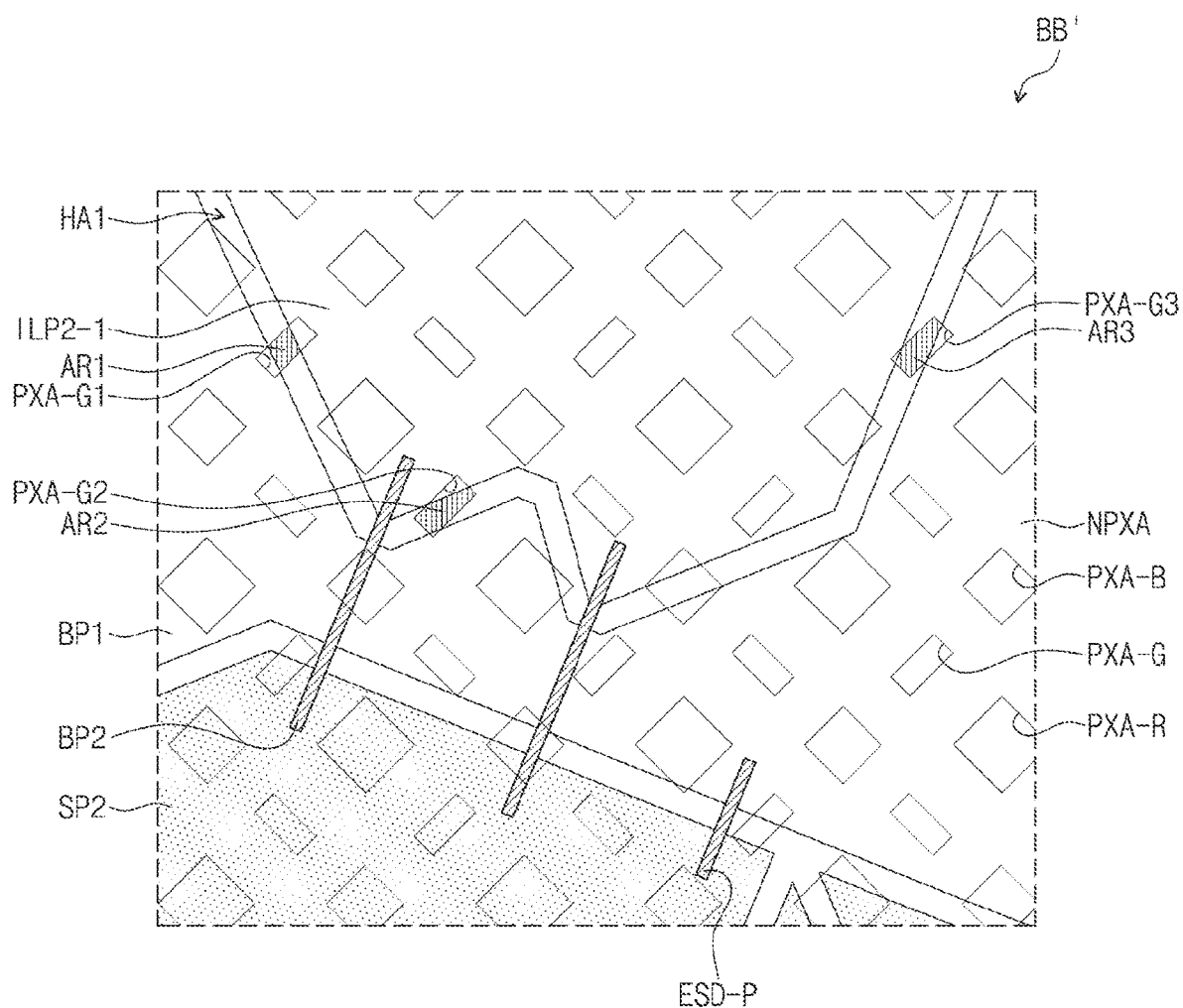
FIG. 11 is a plan view showing a portion BB' of FIG. 9 according to an exemplary embodiment of the inventive concept.

FIG. 11 is a plan view showing a portion BB' of FIG. 9 according to an exemplary embodiment of the inventive concept.

Referring to FIGS. 9 and 11, the light emitting area PXA (refer to FIG. 5) may be classified into a plurality of groups depending on the color of the light generated by the light emitting element OLED (refer to FIG. 5). FIG. 11 shows light emitting areas PXA-R, PXA-B, and PXA-G classified into three groups depending on the color of the emitted light.

The light emitting areas PXA-R, PXA-B, and PXA-G may have different areas from one another depending on the color of the light emitted from the light emitting layer EML of the light emitting element OLED (refer to FIG. 5). The areas of the light emitting areas PXA-R, PXA-B, and PXA-G may be determined depending on the types of the light emitting element OLED (refer to FIG. 5). In FIG. 11, the light emitting areas PXA-R, PXA-B, and PXA-G have different areas from one another; however, the inventive concept is not limited thereto. For instance, the light emitting areas PXA-R, PXA-B, and PXA-G may have the same size as one another.

The light emitting areas PXA-R, PXA-B, and PXA-G may include first light emitting areas PXA-R, second light emitting areas PXA-B, and third light emitting areas PXA-G. The first light emitting areas PXA-R may be red light emitting areas. The second light emitting areas PXA-B may be blue light emitting areas. The third light emitting areas PXA-G may be green light emitting areas. The human eye may be more sensitive to the green light emitting areas, e.g., the third light emitting areas PXA-G, and thus, the third light emitting areas PXA-G may be recognized better than the first light emitting areas PXA-R and the second light emitting areas PXA-B.

An opening HA1 may be formed between the second island pattern ILP2-1 and the first connection pattern BP1. The second island pattern ILP2-1 and the first connection pattern BP1 may not be electrically connected to each other due to the opening HA1. The opening HA1 may overlap the light emitting areas PXA-R, PXA-B, and PXA-G.

A transmittance of light in the second island pattern ILP2-1 and the first connection pattern BP1 may be different from a transmittance of light in the opening HA1. Third light emitting areas PXA-G1, PXA-G2, and PXA-G3 exposed through the opening HA1 among the third light emitting areas PXA-G may include a first exposed area PXA-G1, a second exposed area PXA-G2, and a third exposed area PXA-G3. FIG. 11 shows three third light emitting areas PXA-G1, PXA-G2, and PXA-G3 exposed through the opening HA1; however, the inventive concept is not limited thereto.

A first area AR1 may be defined in the first exposed area PXA-G1 and may be exposed through the opening HA1. A second area AR2 may be defined in the second exposed area PXA-G2 to be exposed through the opening HA1. A third area AR3 may be defined in the third exposed area PXA-G3 to be exposed through the opening HA1.

When a difference in area between the first, second, and third areas AR1, AR2, and AR3 is large, brightness of the third light emitting areas PXA-G exposed through the opening HA1 may be perceived differently. However, according to an exemplary embodiment of the inventive concept, areas of the first to third areas AR1, AR2, and AR3 may have a difference in that the brightness of the third light emitting areas PXA-G exposed through the opening HA1 may be perceived at substantially the same brightness from the outside. Thus, the visibility of the display device EA (refer to FIG. 1) may be improved.

The second connection pattern BP2 and the electrostatic discharge pattern ESD-P may not overlap the third light emitting areas PXA-G. When the second connection pattern BP2 and the electrostatic discharge pattern ESD-P overlap the third light emitting areas PXA-G, the third light emitting areas PXA-G are covered by the second connection pattern BP2 and the electrostatic discharge pattern ESD-P, which include an opaque conductive material, and thus, the third light emitting areas PXA-G may be perceived as a dark spot. However, according to an exemplary embodiment of the inventive concept, the second connection pattern BP2 and the electrostatic discharge pattern ESD-P do not overlap the third light emitting areas PXA-G in the display device EA (refer to FIG. 1), and thus the dark spot may not be perceived. As a result, the visibility of the display device EA (refer to FIG. 1) may be improved.

Figure 12:
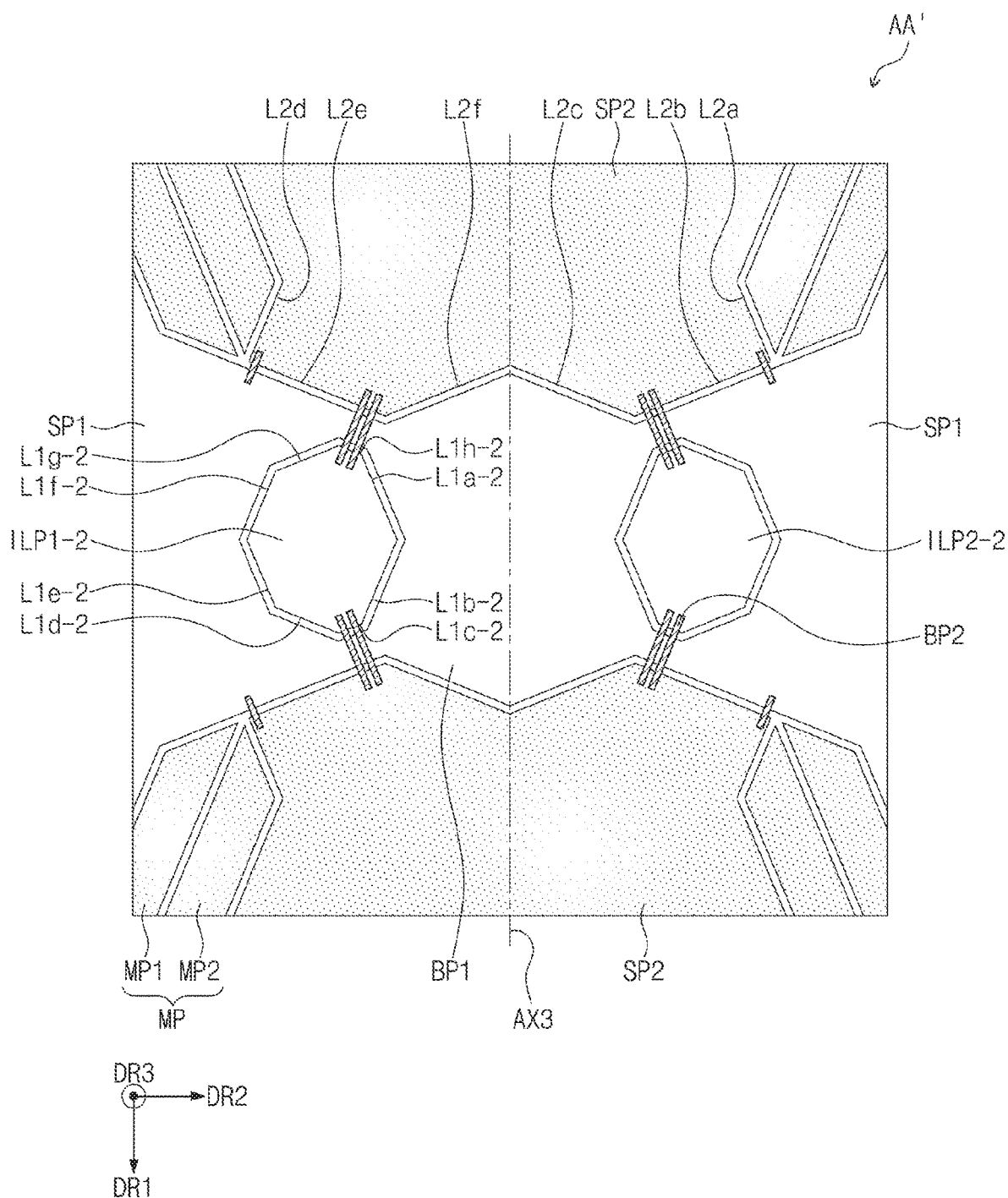
FIGS. 12 to 14 are plan views showing the portion AA' of FIG. 6 according to exemplary embodiments of the inventive concept.

FIG. 12 is a plan view showing the portion AA' of FIG. 6 according to an exemplary embodiment of the inventive concept. In FIG. 12, the same reference numerals denote the same elements shown in FIG. 7, and thus, detailed descriptions of the same elements will be omitted.

Referring to FIG. 12, island patterns ILP1-2 and ILP2-2 may be insulated from the first sensing patterns SP1 and the first connection pattern BP1, and may be electrically connected to the second sensing patterns SP2. The island patterns ILP1-2 and ILP2-2 may include a first island pattern ILP1-2 and a second island pattern ILP2-2.

The first island pattern ILP1-2 may have an octagonal shape. The first island pattern ILP1-2 may include first, second, third, fourth, fifth, sixth, seventh, and eighth sides L1a-2, L1b-2, L1c-2, L1d-2, L1e-2, L1f-2, L1g-2, and L1h-2.

The first side L1a-2 and the fifth side L1e-2 of the first island pattern ILP1-2 may be substantially parallel to the first side L2a of each of the second sensing patterns SP2. The second side L1b-2 and the sixth side L1f-2 of the first island pattern ILP1-2 may be substantially parallel to the fourth side L2d of each of the second sensing patterns SP2. The third side L1c-2 and the seventh side L1g-2 of the first island pattern ILP1-2 may be substantially parallel to the second side L2b and the sixth side L2f of each of the second sensing patterns SP2. The fourth side L1d-2 and the eighth side L1h-2 of the first island pattern ILP1-2 may be substantially parallel to the third side L2c and the fifth side L2e of each of the second sensing patterns SP2.

The second island pattern ILP2-2 may have a shape that is symmetrical with respect to the first island pattern ILP1-2 about a third axis AX3 extending in the first direction DR1. The second island pattern ILP2-2 may be spaced apart from the first island pattern ILP1-2 in the second direction DR2.

Each of the first and second island patterns ILP1-2 and ILP2-2 may be connected to at least two pairs of the second connection patterns BP2. In other words, each of the first and second island patterns ILP1-2 and ILP2-2 may be connected to four second connection patterns BP2. According to an exemplary embodiment of the inventive concept, although some portions of the second connection patterns BP2 may be damaged and disconnected due static electricity introduced from the outside, the second sensing patterns SP2 may be electrically connected to each other by the second connection patterns BP2 that are not damaged. Accordingly, the display device EA (refer to FIG. 1) may have improved reliability.

Figure 13:
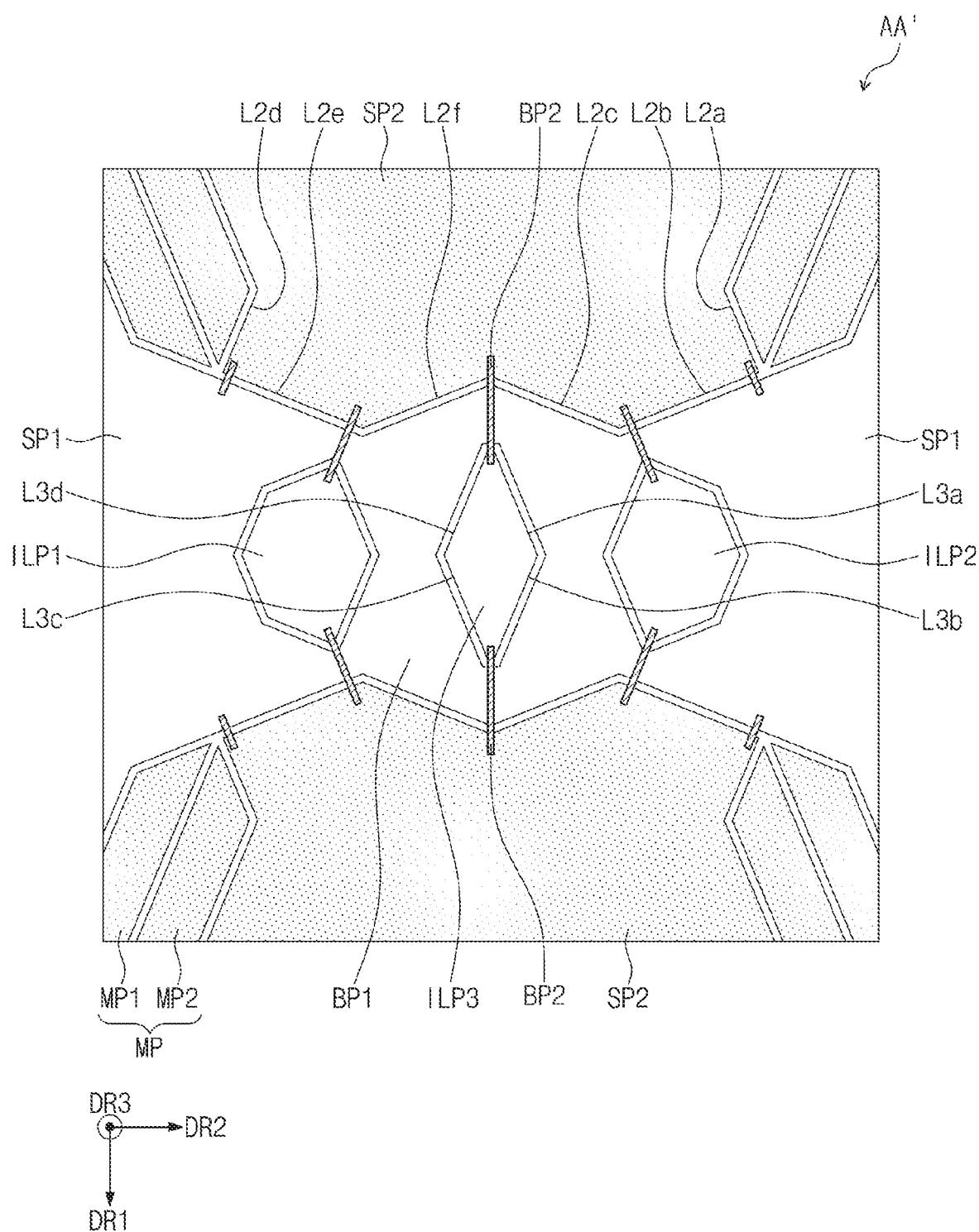

FIG. 13 is a plan view showing the portion AA' of FIG. 6 according to an exemplary embodiment of the inventive concept. In FIG. 13, the same reference numerals denote the same elements shown in FIG. 7, and thus, detailed descriptions of the same elements will be omitted.

Referring to FIG. 13, the second sensing electrode TE2 (refer to FIG. 6) may further include a third island pattern ILP3. The third island pattern ILP3 may be insulated from the first sensing patterns SP1 and the first connection pattern BP1, and may be electrically connected to the second sensing patterns SP2. The third island pattern ILP3 may be disposed between the first island pattern ILP1 and the second island pattern ILP2.

The third island pattern ILP3 may have a quadrangular shape. The third island pattern ILP3 may include first, second, third, and fourth sides L3a, L3b, L3c, and L3d.

The first side L3a and the third side L3c of the third island pattern ILP3 may be substantially parallel to the first side L2a of each of the second sensing patterns SP2. The second side L3b and the fourth side L3d of the third island pattern ILP3 may be substantially parallel to the fourth side L2d of each of the second sensing patterns SP2.

The third island pattern ILP3 may be connected to at least one pair of the second connection patterns BP2. Each of the second connection patterns BP2 connected to the third island pattern ILP3 may extend in a direction substantially parallel to the first direction DR1. The number of the second connection patterns BP2 that connect the second sensing patterns SP2 may increase due to the third island pattern ILP3. According to an exemplary embodiment of the inventive concept, although some portions of the second connection patterns BP2 may be damaged and disconnected due static electricity introduced from the outside, the second sensing patterns SP2 may be electrically connected to each other by the second connection patterns BP2 that are not damaged. Accordingly, the display device EA (refer to FIG. 1) may have improved reliability.

Figure 14:
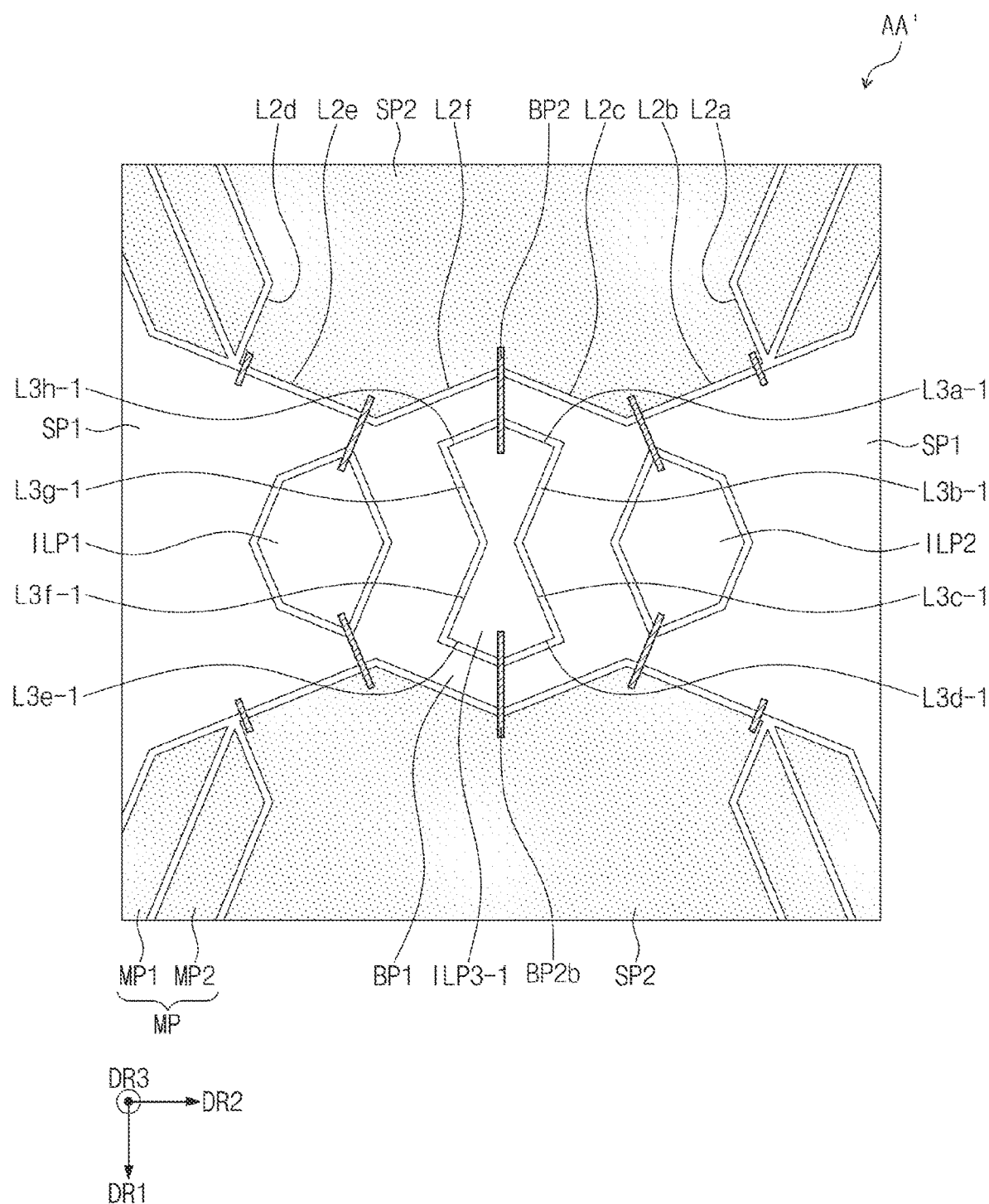

FIG. 14 is a plan view showing the portion AA' of FIG. 6 according to an exemplary embodiment of the inventive concept. In FIG. 14, the same reference numerals denote the same elements shown in FIG. 7, and thus, detailed descriptions of the same elements will be omitted.

Referring to FIG. 14, the second sensing electrode TE2 (refer to FIG. 6) may further include a third island pattern ILP3-1. The third island pattern ILP3-1 may be insulated from the first sensing patterns SP1 and the first connection pattern BP1, and may be electrically connected to the second sensing patterns SP2. The third island pattern ILP3-1 may be disposed between the first island pattern ILP1 and the second island pattern ILP2.

The third island pattern ILP3-1 may have a free-form shape. The third island pattern ILP3-1 may include first, second, third, fourth, fifth, sixth, seventh, and eighth sides L3a-1, L3b-1, L3c-1, L3d-1, L3e-1, L3f-1, L3g-1, and L3h-1.

The first side L3a-1 and the fifth side L3e-1 of the third island pattern ILP3-1 may be substantially parallel to the third side L2c and the fifth side L2e of each of the second sensing patterns SP2. The second side L3b-1 and the sixth side L3f-1 of the third island pattern ILP3-1 may be substantially parallel to the fourth side L2d of each of the second sensing patterns SP2. The third side L3c-1 and the seventh side L3g-1 of the third island pattern ILP3-1 may be substantially parallel to the first side L2a of each of the second sensing patterns SP2. The fourth side L3d-1 and the eighth side L3h-1 of the third island pattern ILP3-1 may be substantially parallel to the second side L2b and the sixth side L2f of each of the second sensing patterns SP2.

The third island pattern ILP3-1 may be connected to at least one pair of the second connection patterns BP2. Each of the second connection patterns BP2 connected to the third island pattern ILP3-1 may extend in a direction substantially parallel to the first direction DR1. The number of the second connection patterns BP2 that connect the second sensing patterns SP2 may increase due to the third island pattern ILP3-1. According to an exemplary embodiment of the inventive concept, although some portions of the second connection patterns BP2 may be damaged and disconnected due static electricity introduced from the outside, the second sensing patterns SP2 may be electrically connected to each other by the second connection patterns BP2 that are not damaged. Accordingly, the display device EA (refer to FIG. 1) may have improved reliability.

According to the above exemplary embodiments of the inventive concept, the display device may include the display panel and the input sensing panel, and the input sensing panel may include the sensing patterns, the connection patterns, and the island patterns. At least two pairs of the connection patterns may be provided to the island patterns. Although some connection patterns among the connection patterns may be damaged due to static electricity introduced from the outside, the sensing patterns may be electrically connected to each other by the other connection patterns. Thus, the reliability of the display device may be improved.

While the inventive concept has been shown and described with reference to exemplary embodiments thereof, it will be apparent to those of ordinary skill in the art that various changes and modifications in form and details may be made thereto without departing from the spirit and scope of the inventive concept as set forth by the appended claims.

What is claimed is:

1. A display device comprising:
a display panel comprising first light emitting areas, second light emitting areas, and third light emitting areas; and
an input sensing panel disposed on the display panel and comprising a first sensing electrode and a second sensing electrode,
wherein the first sensing electrode comprises first sensing patterns and at least one first connection pattern connecting two first sensing patterns adjacent to each other among the first sensing patterns,
the second sensing electrode comprises second sensing patterns, at least one island pattern disposed between two second sensing patterns adjacent to each other among the second sensing patterns, and second connection patterns connecting the second sensing patterns and the at least one island pattern, and
wherein an opening is formed between the at least one island pattern and the at least one first connection pattern, and the third light emitting areas exposed through the opening have substantially the same size as one another in a plan view.

2. The display device of claim 1, wherein the second connection patterns do not overlap the third light emitting areas in a plan view.

3. The display device of claim 1, wherein the third light emitting areas are green light emitting areas.

4. A display device comprising:
a display panel comprising first light emitting areas, second light emitting areas, and third light emitting areas; and
an input sensing panel disposed on the display panel and comprising a first sensing electrode and a second sensing electrode,
wherein the first sensing electrode comprises first sensing patterns and at least one first connection pattern connecting two first sensing patterns adjacent to each other among the first sensing patterns,
the second sensing electrode comprises second sensing patterns, at least one island pattern disposed between two second sensing patterns adjacent to each other among the second sensing patterns, and second connection patterns connecting the second sensing patterns and the at least one island pattern, and
wherein each side of the at least one island pattern is substantially parallel to at least one side of each of the second sensing patterns, and
wherein the at least one island pattern comprises:
a first island pattern; and
a second island pattern having a symmetrical shape with respect to the first island pattern about an axis extending in a first direction and spaced apart from the first island pattern in a second direction crossing the first direction.

5. The display device of claim 4, wherein a number of the second connection patterns connected to the first island pattern is four, and a number of the second connection patterns connected to the second island pattern is four.

6. The display device of claim 4, wherein the at least one island pattern further comprises a third island pattern disposed between the first island pattern and the second island pattern.

7. The display device of claim 6, wherein a second connection pattern connected to the third island pattern among the second connection patterns is substantially parallel to the first direction.

8. The display device of claim 1, wherein the second sensing electrode further comprises an electrostatic discharge pattern connected to the second sensing patterns, and the electrostatic discharge pattern is disposed on a same layer as the second connection patterns.

9. The display device of claim 8, wherein the electrostatic discharge pattern does not overlap the third light emitting areas in a plan view.

10. The display device of claim 1, wherein the input sensing panel further comprises dummy patterns disposed between the first sensing patterns and the second sensing patterns.

11. The display device of claim 10, wherein the each side of the at least one island pattern is substantially parallel to at least one side of the dummy patterns.

12. The display device of claim 1, wherein the at least one first connection pattern is disposed on a layer different from a layer on which the second connection patterns are disposed.

13. The display device of claim 1, wherein the first sensing electrode is disposed on the display panel, and the second connection patterns are disposed on the first sensing electrode.

14. The display device of claim 1, wherein a number of the second connection patterns connected to the at least one island pattern is four.

15. A display device comprising:
a display panel comprising first light emitting areas, second light emitting areas, and third light emitting areas; and
an input sensing panel disposed on the display panel, wherein the input sensing panel comprises:
first sensing patterns disposed on the display panel;
at least one first connection pattern disposed on the display panel and connecting two first sensing patterns adjacent to each other among the first sensing patterns;
second sensing patterns disposed on the display panel;
at least one island pattern disposed on the display panel, disposed between two second sensing patterns adjacent to each other among the second sensing patterns, and surrounded by the at least one first connection pattern; and
second connection patterns disposed on the first sensing patterns and connecting the second sensing patterns and the at least one island pattern, wherein the second connection patterns do not overlap the third light emitting areas in a plan view, and wherein the at least one first connection pattern is disposed on a layer different from a layer on which the second connection patterns are disposed.

16. The display device of claim 15, wherein each side of the at least one island pattern is substantially parallel to at least one side of the second sensing patterns.

17. The display device of claim 15, wherein a number of the second connection patterns connected to the at least one island pattern is four.

18. The display device of claim 15, wherein the third light emitting areas are green light emitting areas.

* * * * *